(12) United States Patent
Song et al.

(10) Patent No.: US 10,972,068 B2
(45) Date of Patent: Apr. 6, 2021

(54) PROCESS-INVARIANT DELAY CELL

(71) Applicant: QUALCOMM Incorporated, San Diego, CA (US)

(72) Inventors: Chao Song, San Diego, CA (US); Haitao Cheng, San Diego, CA (US); Ye Lu, San Diego, CA (US); Dongjiang Qiao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 217 days.

(21) Appl. No.: 16/023,186

(22) Filed: Jun. 29, 2018

(65) Prior Publication Data

US 2020/0007105 A1 Jan. 2, 2020

(51) Int. Cl.
| | | |
|---|---|---|
| *H03H 7/30* | (2006.01) |
| *H03H 1/02* | (2006.01) |
| *H03H 3/00* | (2006.01) |
| *H03H 7/06* | (2006.01) |
| *H01L 49/02* | (2006.01) |
| *H01L 23/66* | (2006.01) |
| *H01L 23/522* | (2006.01) |
| *H01L 23/528* | (2006.01) |
| *H01L 23/532* | (2006.01) |

(52) U.S. Cl.
CPC .......... *H03H 7/30* (2013.01); *H01L 23/5222* (2013.01); *H01L 23/5228* (2013.01); *H01L 23/5283* (2013.01); *H01L 23/53271* (2013.01); *H01L 23/66* (2013.01); *H01L 28/20* (2013.01); *H01L 28/60* (2013.01); *H03H 1/02* (2013.01); *H03H 3/00* (2013.01); *H03H 7/06* (2013.01); *H01L 2223/6661* (2013.01)

(58) Field of Classification Search
None
See application file for complete search history.

(56) References Cited

U.S. PATENT DOCUMENTS

| | | | | |
|---|---|---|---|---|
| 3,569,872 | A | * | 3/1971 | Berlin ...................... H03H 1/02 333/172 |
| 4,560,963 | A | * | 12/1985 | Sharpe ............... H03H 11/1204 257/533 |
| 4,866,502 | A | | 9/1989 | Tomaszewski et al. |
| 5,541,442 | A | * | 7/1996 | Keil ....................... H01L 27/08 257/531 |
| 5,597,759 | A | * | 1/1997 | Yoshimori .......... H01L 27/0688 438/384 |
| 5,701,025 | A | | 12/1997 | Yoshimori |
| 6,603,172 | B1 | | 8/2003 | Segawa et al. |
| 7,838,919 | B2 | * | 11/2010 | Okamoto ............... H01G 4/005 257/307 |
| 2002/0175748 | A1 | * | 11/2002 | Nishikawa ............... H05K 1/16 327/552 |

(Continued)

FOREIGN PATENT DOCUMENTS

KR 100712491 B1 5/2007

*Primary Examiner* — Lex H Malsawma
(74) *Attorney, Agent, or Firm* — Qualcomm Incorporated (57) ABSTRACT

An integrated circuit (IC) device includes a first resistive strip having an input terminal and an output terminal. The IC device further includes a second resistive strip having a terminal coupled to a voltage. The second resistive strip may be coplanar with the first resistive strip. The IC device further includes a capacitor formed by the first resistive strip and the second resistive strip.

20 Claims, 9 Drawing Sheets

(56) References Cited

U.S. PATENT DOCUMENTS

| | | | |
|---|---|---|---|
| 2004/0174655 A1* | 9/2004 | Tsai | H01L 23/5223 |
| | | | 361/306.3 |
| 2007/0075397 A1* | 4/2007 | Zhang | H01L 27/0805 |
| | | | 257/532 |
| 2010/0090741 A1* | 4/2010 | Takahashi | H03H 11/26 |
| | | | 327/290 |

* cited by examiner

PROCESS-INVARIANT DELAY CELL

BACKGROUND

Field

Aspects of the present disclosure relate to semiconductor devices and, more particularly, to delay cells.

Background

Mobile radio frequency (RF) chips (e.g., mobile RF transceivers) have migrated to a deep sub-micron process node due to cost and power consumption considerations. Designing such mobile RF transceivers becomes complex at this deep sub-micron process node. Designing these mobile RF transceivers is further complicated by added circuit functions for supporting communications enhancements, such as fifth generation (5G) communications. Further design challenges for mobile RF transceivers include analog/RF performance considerations, including mismatch, noise, and other performance considerations. Designs of these mobile RF transceivers may include additional passive devices, for example, for biasing and suppressing resonance, and/or for performing filtering, bypassing, and coupling.

Conventional resistor-capacitor (RC) delay cells are implemented using resistors (R) and capacitors (C) and occupy a large area on a chip. This is because a significant number of resistors and capacitors are used in RC delay cells. Additionally, process variations while fabricating these resistors and capacitors may lead to inaccuracies in the functioning of the RC delay cells. Therefore, it is desirable to have a delay cell that is process-invariant and also occupies a reduced area on a chip.

SUMMARY

An integrated circuit (IC) device includes a first resistive strip having an input terminal and an output terminal. The IC device further includes a second resistive strip having a terminal coupled to a voltage. The second resistive strip may be coplanar with the first resistive strip. The IC device further includes a capacitor formed by the first resistive strip and the second resistive strip.

A method of fabricating an integrated circuit (IC) device includes fabricating a first resistive strip having an input terminal and an output terminal. The method further includes fabricating a second resistive strip coplanar with the first resistive strip. The second resistive strip includes a terminal. The first resistive strip and the second resistive strip form a capacitor. The method further includes coupling the terminal to a voltage.

An integrated circuit (IC) device includes a first resistive means coupled to an input terminal and an output terminal. The IC device further includes a second resistive means coupled to a voltage. The IC device further includes a capacitor formed by the first resistive means and the second resistive means.

Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to."

As described herein, the term "on" used throughout this description means "directly on" in some configurations, and "indirectly on" in other configurations.

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communications enhancements, such as fifth generation (5G) wireless communications. In particular, mobile RF chips are a major driving force for advancing miniaturization of electronics. While tremendous improvements are being realized for miniaturizing wireless communications subsystems, such as mobile RF transceivers, RF passive devices have not experienced such improvements.

These mobile RF transceivers may be designed using RF delay cells. For example, mobile RF transceivers in wireless communications systems generally rely on RF (e.g., resistor-capacitor (RC)) delay cells for processing signals carried in the wireless communications system. Many passive devices may be included in these RF delay cells. In practice, each of these passive devices may include many resistors and capacitors. Designing RF filters for mobile RF transceivers involves analog/RF performance considerations, including mismatch, noise and other performance considerations. Designing these mobile RF transceivers may include using additional passive devices, for example, for suppressing resonance, and/or for performing filtering, bypassing, and coupling.

Conventional resistor-capacitor (RC) delay cells are implemented using resistors (R) and capacitors (C) and occupy a large area on a chip. This is because many resistors and capacitors are used in RC delay cells. Additionally, process variation in fabrication of these resistors and capacitors may lead to inaccuracies in the functioning of the RC delay cells. Therefore, it is desirable to have a delay cell that is process-invariant and also occupies a reduced area on a chip.

Various aspects of the present disclosure provide techniques for fabricating process-invariant RC delay cells that occupy a reduced chip area. The process flow for fabrication of the RC delay cells may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

According to aspects of the present disclosure, resistive strips (e.g., polysilicon) may be implemented in a delay cell to combine the functionality of resistors and capacitors of the delay cell. The resulting delay cell is immune to process variation. Advantages of the delay cell include immunity to process variation, integrating resistors and capacitors into a single integrated device (IC), and cost and area savings due to the combining of the resistors and capacitors.

Figure 1:
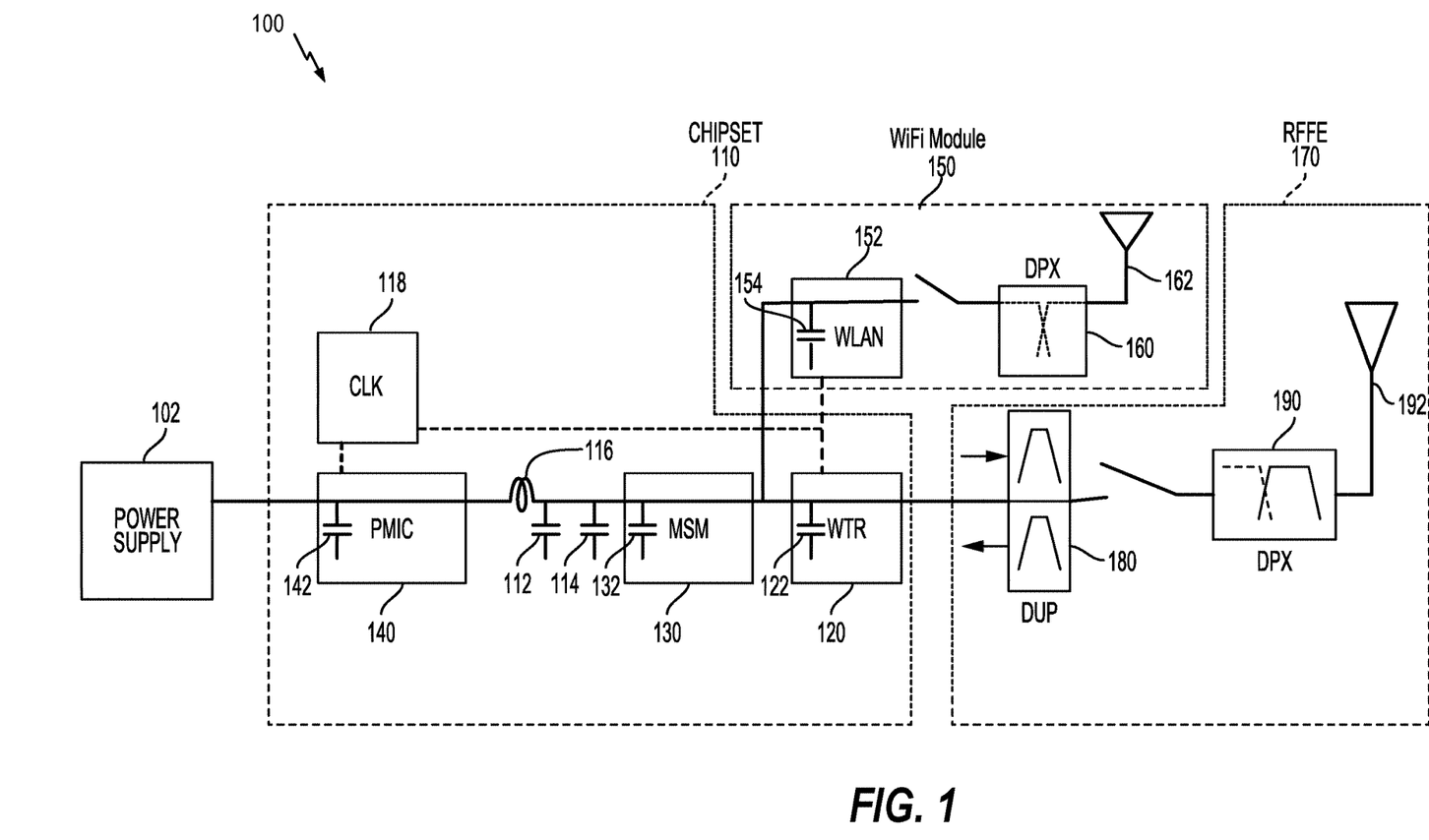
FIG. 1 is a schematic diagram of a radio frequency (RF) front-end module.

FIG. 1 is a schematic diagram of a wireless device 100 (e.g., a cellular phone or a smartphone) having a delay cell, according to aspects of the present disclosure. The wireless device 100 may include a wireless local area network (WLAN) (e.g., WiFi) module 150 and a RF front-end module 170 for a chipset 110. The WiFi module 150 includes a first diplexer 160 communicably coupling an antenna 162 to a wireless local area network module (e.g., WLAN module 152). The RF front-end module 170 includes a second diplexer 190 communicably coupling an antenna 192 to the wireless transceiver 120 (WTR) through a duplexer 180 (DUP).

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile RF transceiver to transmit and receive data for two-way communication. A mobile RF transceiver may include a transmit section for data transmission and a receive section for data reception. For data transmission, the transmit section may modulate a RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communications signal.

The wireless transceiver 120 may include one or more circuits for amplifying these communications signals. The amplifier circuits (e.g., LNA/PA) may include one or more amplifier stages that may have one or more driver stages and one or more amplifier output stages. Each of the amplifier stages includes one or more transistors configured in various ways to amplify the communications signals. Various options exist for fabricating the transistors that are configured to amplify the communications signals transmitted and received by the wireless transceiver 120.

Figure 2:
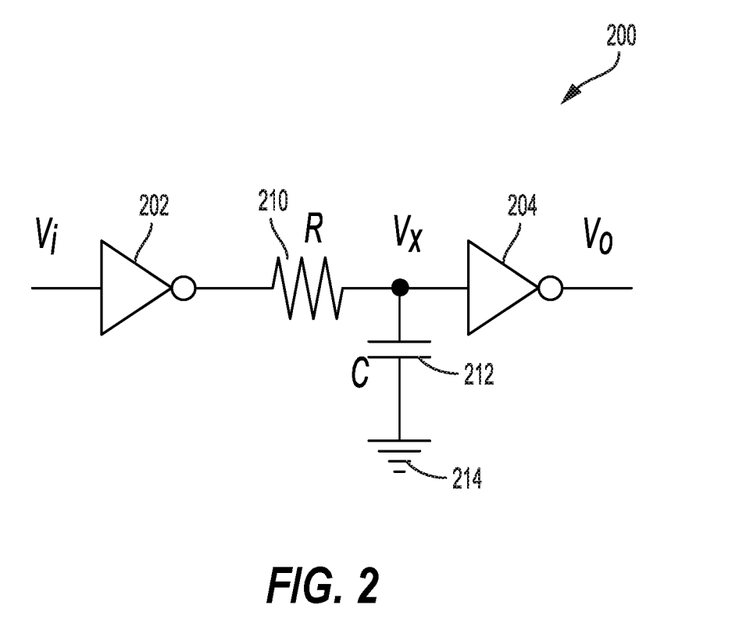
FIG. 2 is a schematic diagram of a conventional delay cell.

FIG. 2 is a schematic diagram of a conventional delay cell 200. The conventional delay cell 200 includes a resistor 210 coupled between a first inverter 202 and a second inverter 204. A capacitor 212 is coupled between the resistor 210 and the second inverter 204. The capacitor 212 is also coupled to ground 214.

An input voltage (Vi) is coupled to an input of the first inverter 202. An output voltage (Vo) is coupled to an output of the second inverter 204. Voltage Vx is a measured voltage at the node between the resistor 210, the capacitor 212, and the second inverter 204.

The conventional delay cell 200 is implemented with resistors 210 and capacitors 212 separately. As a result, its performance is dependent upon process variations in the resistors (around ±20%), the capacitors (around ±20%), and a product of the resistors and capacitors (around ±30%). As a result, the conventional delay cell 200 has a three sigma variation of around ±30%.

This is because process variation in fabrication of the resistors 210 and capacitors 212 leads to inaccuracies in the functioning of the conventional delay cell 200. Additionally, the resistors 210 and capacitors 212 occupy a large area on a chip. Therefore, it is desirable to have a delay cell that is process-invariant and also occupies a reduced area on a chip.

According to aspects of the present disclosure, resistive strips (e.g., polysilicon) may be implemented in a delay cell to combine the functionality of resistors and capacitors. The resulting delay cell is also process-invariant. Although described with respect to a delay cell, the present disclosure has other applications, such as a filter.

Figure 3:
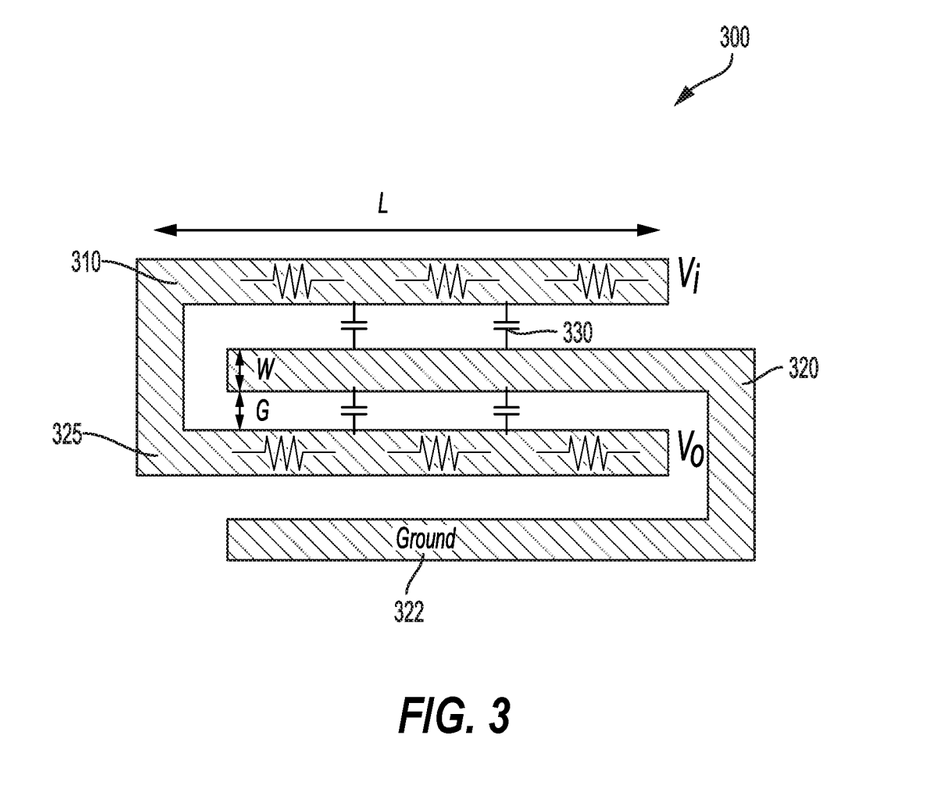
FIG. 3 illustrates a top view of an interdigitated delay cell, according to aspects of the present disclosure.

FIG. 3 illustrates a top view of a delay cell 300, according to aspects of the present disclosure. The delay cell 300 may be interdigitated. For example, a first resistive strip 310 may be interdigitated with a second resistive strip 320. Each of the first resistive strip 310 and the second resistive strip 320 provides a resistance.

The first resistive strip 310 may include an input terminal (Vi) and an output terminal (Vo). In an alternate configuration, the output terminal is moved to a location 325, if a reduced resistance is desired.

The second resistive strip 320 may include a terminal 322 coupled to a voltage (e.g., ground). The second resistive strip 320 may be coplanar with the first resistive strip 310. Alternatively, the first resistive strip 310 may be on a first layer and the second resistive strip 320 may be on a second layer that is different from the first layer.

A capacitor 330 is formed by the first resistive strip 310 and the second resistive strip 320. For example, the capacitor 330 includes a gap (G) between the first resistive strip 310 and the second resistive strip 320. The gap may be filled with a dielectric material, such as silicon nitride or silicon oxide. Additionally, each of the first resistive strip 310 and the second resistive strip 320 has a width (W). For example, the widths may be the same or different.

The second resistive strip 320 may include portions substantially parallel to the first resistive strip 310. For example, a size of the gap between the first resistive strip 310 and the second resistive strip 320 may be uniform. In alternative configurations, the size of the gap varies. According to certain aspects of the present disclosure, the width of the first resistive strip 310 is substantially equal to the gap between the first resistive strip 310 and the second resistive strip 320 to improve cancellation with regards to process variation. In one example configuration, the width and gap are both between 20 and 30 nanometers.

The first resistive strip 310 and the second resistive strip 320 may be polysilicon, or any other electrically resistive material. According to aspects of the present disclosure, the first resistive strip 310 may include a first resistive material and the second resistive strip 320 may include a second resistive material that is different from the first resistive material.

According to aspects of the present disclosure, the delay cell 300 has a process-invariant resistor-capacitor (RC) time constant. For example, the process-invariant RC time constant may vary within 10%. This is possible because the delay cell 300 is process-invariant.

Assuming:

$$R \propto \rho \frac{L}{T \times W}, \text{ and} \quad (1)$$

$$C \propto \varepsilon \frac{L \times T}{G}, \quad (2)$$

where R: resistance, C: capacitance, L: length, ρ: resistivity of resistive material (e.g., polysilicon); ε: permittivity of dielectric material (e.g., insulation layer); T: thickness (depth) of resistive material, W: width, and G: gap.

$$RC = \rho \varepsilon \frac{L^2}{W \times G}, \quad (3)$$

where T is cancelled.

Assuming W equals G, if W is reduced by X % because of over etching, G will increase by X % accordingly. This is because W and G are correlated. As W increases, G decreases, and vice versa.

This means that: W(1−X %)×G(1+X %)≈W×G. No matter the variation in W and G, the product of W and G will remain constant. Therefore, assuming L is large, process variation is insignificant because ρ and ε values remain stable over the process. As a result, the RC time constant of the delay cell 300 is process-invariant.

According to aspects of the present disclosure, the first resistive strip 310 and the second resistive strip 320 may be serpentine, spiral, octagonal, and/or circular in shape, as described with reference to FIGS. 4, 5, 6, and 7 below.

Advantages of the delay cell include immunity to process variation, integrating resistors and capacitors into a single integrated device (IC), and cost and area savings due to the combining of the resistors and capacitors.

Figure 4:
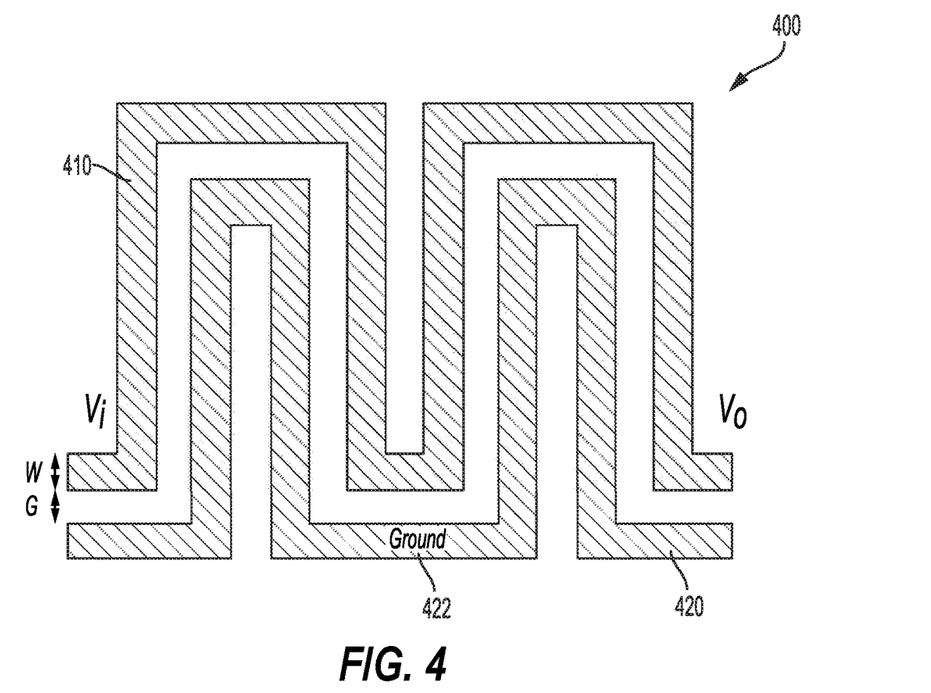
FIG. 4 illustrates a top view of a delay cell having a serpentine shape, according to aspects of the present disclosure.

FIG. 4 illustrates a top view of a delay cell 400 having a serpentine shape, according to aspects of the present disclosure. The delay cell 400 may include a first resistive strip 410 and a second resistive strip 420. Each of the first resistive strip 410 and the second resistive strip 420 provides a resistance. The first resistive strip 410 may include an input terminal (Vi) and an output terminal (Vo). The second resistive strip 420 may include a terminal 422 coupled to a voltage (e.g., ground).

The first resistive strip 410 and the second resistive strip 420 have portions substantially parallel to each other. A gap (G) between the first resistive strip 410 and the second resistive strip 420 defines a capacitance. Each of the first resistive strip 410 and the second resistive strip 420 may have a width (W). Similar to the above, the gap and the width may be uniform or may vary. In one configuration the width and gap are substantially equal to each other, ensuring cancellation, e.g., making the delay cell 400 process-invariant.

Figure 5:
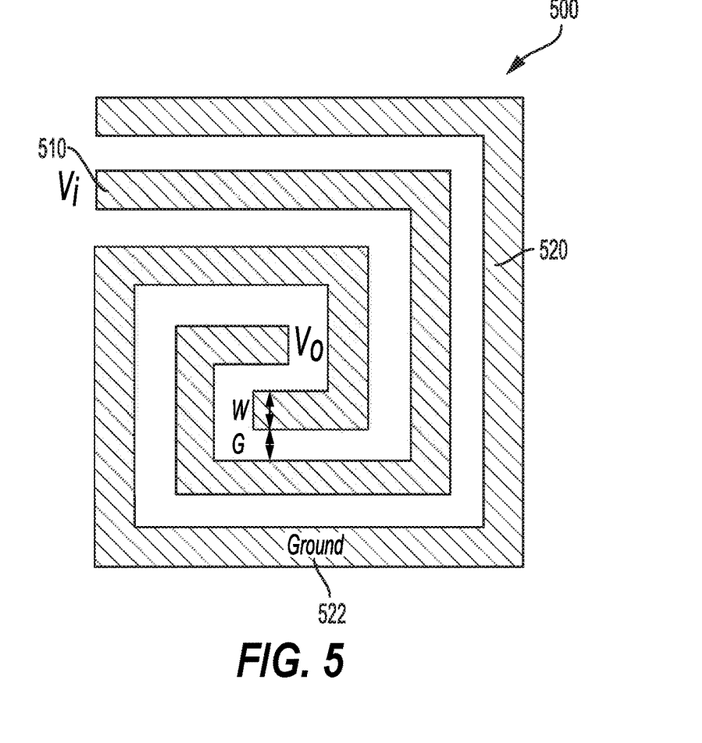
FIG. 5 illustrates a top view of a delay cell having a spiral shape, according to aspects of the present disclosure.

FIG. 5 illustrates a top view of a delay cell 500 having a spiral shape, according to aspects of the present disclosure. The delay cell 500 may include a first resistive strip 510 and a second resistive strip 520 arranged in a spiral. The spiral may be a square spiral. For example, each of the first resistive strip 510 and the second resistive strip 520 may include multiple turns, and may provide a resistance. The first resistive strip 510 may be an inner spiral, and may include an input terminal (Vi) and an output terminal (Vo). The second resistive strip 520 may be an outer spiral, and may include a terminal 522 coupled to a voltage (e.g., ground).

The first resistive strip 510 and the second resistive strip 520 may have portions substantially parallel to each other. A gap (G) between the first resistive strip 510 and the second resistive strip 520 defines a capacitance. Each of the first resistive strip 510 and the second resistive strip 520 has a width (W). The gap and the width may be uniform or may vary. In one configuration the width and gap are substantially equal to each other, ensuring cancellation, e.g., making the delay cell 500 process-invariant.

Figure 6:
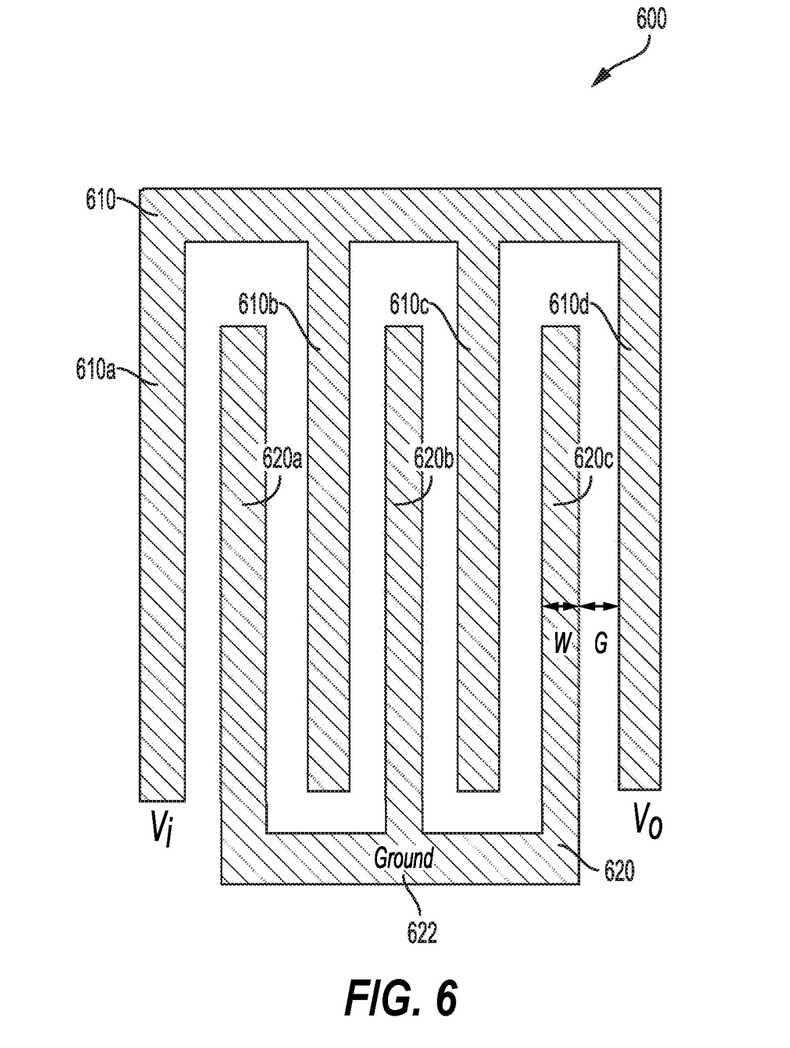
FIG. 6 illustrates a top view of an interdigitated delay cell, according to aspects of the present disclosure.

FIG. 6 illustrates a top view of a delay cell 600, according to aspects of the present disclosure. The delay cell 600 includes interdigitated strips. For example, a first resistive strip 610 and a second resistive strip 620 are interdigitated with each other. Each of the first resistive strip 610 and the second resistive strip 620 provides a resistance. The first resistive strip 610 may include an input terminal (Vi) and an output terminal (Vo). The second resistive strip 620 may include a terminal 622 coupled to a voltage (e.g., ground).

According to aspects of the present disclosure, the first resistive strip 610 is substantially M-shaped with multiple fingers. For example, the first resistive strip 610 may include at least four fingers 610a-610d, and the second resistive strip 620 may include at least three fingers 620a-620c. Each of the fingers 610a-610d may be interdigitated with the fingers 620a-620b to be substantially parallel to each other.

A gap (G) between the first resistive strip 610 and the second resistive strip 620 defines a capacitance. Each of the first resistive strip 610 and the second resistive strip 620 has a width (W). Similar to the above, the gap and the width may be uniform or may vary. In one configuration the width and gap are substantially equal to each other, ensuring cancellation, e.g., making the delay cell 600 process-invariant.

Figure 7:
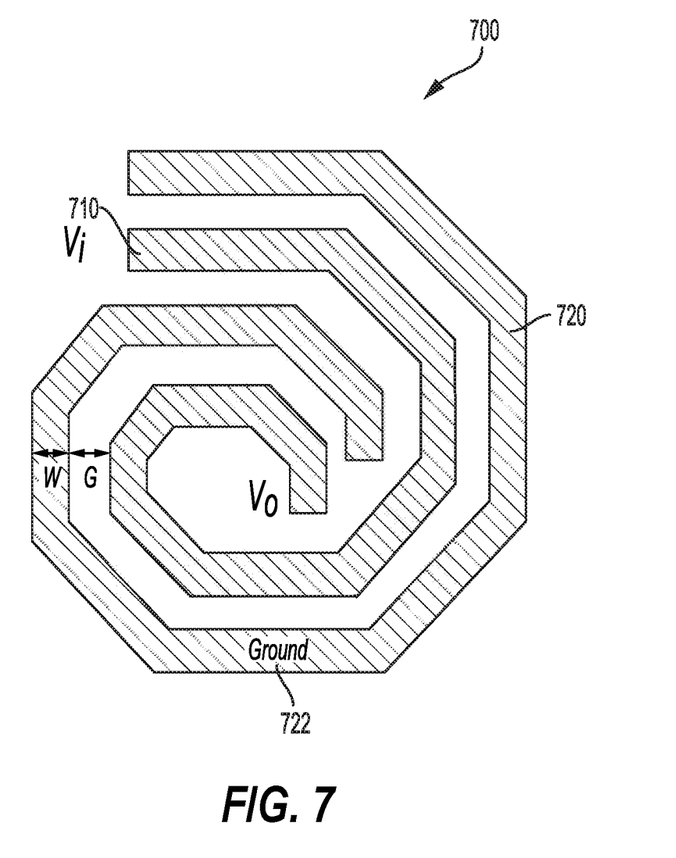
FIG. 7 illustrates a top view of a delay cell having a spiral shape, according to aspects of the present disclosure.

FIG. 7 illustrates a top view of a delay cell 700 having a spiral shape, according to aspects of the present disclosure. The delay cell 700 may include a first resistive strip 710 and a second resistive strip 720 arranged in a spiral. The spiral may be an octagonal spiral. For example, each of the first resistive strip 710 and the second resistive strip 720 includes multiple turns, and provides a resistance. The first resistive strip 710 is an inner spiral, and may include an input terminal (Vi) and an output terminal (Vo). The second resistive strip 720 is an outer spiral, and may include a terminal 722 coupled to a voltage (e.g., ground).

The first resistive strip 710 and the second resistive strip 720 may have portions substantially parallel to each other. A gap (G) between the first resistive strip 710 and the second resistive strip 720 defines a capacitance. Each of the first resistive strip 710 and the second resistive strip 720 has a width (W). Similar to the above, the gap and the width may be uniform or may vary. In one configuration the width and gap are substantially equal to each other, ensuring cancellation, e.g., making the delay cell 700 process-invariant.

According to additional aspects of the present disclosure, the delay cells (e.g., 300-700) may also have a circular shape. Of course, the shapes discussed are exemplary only and other shapes/arrangements are possible.

Figure 8:
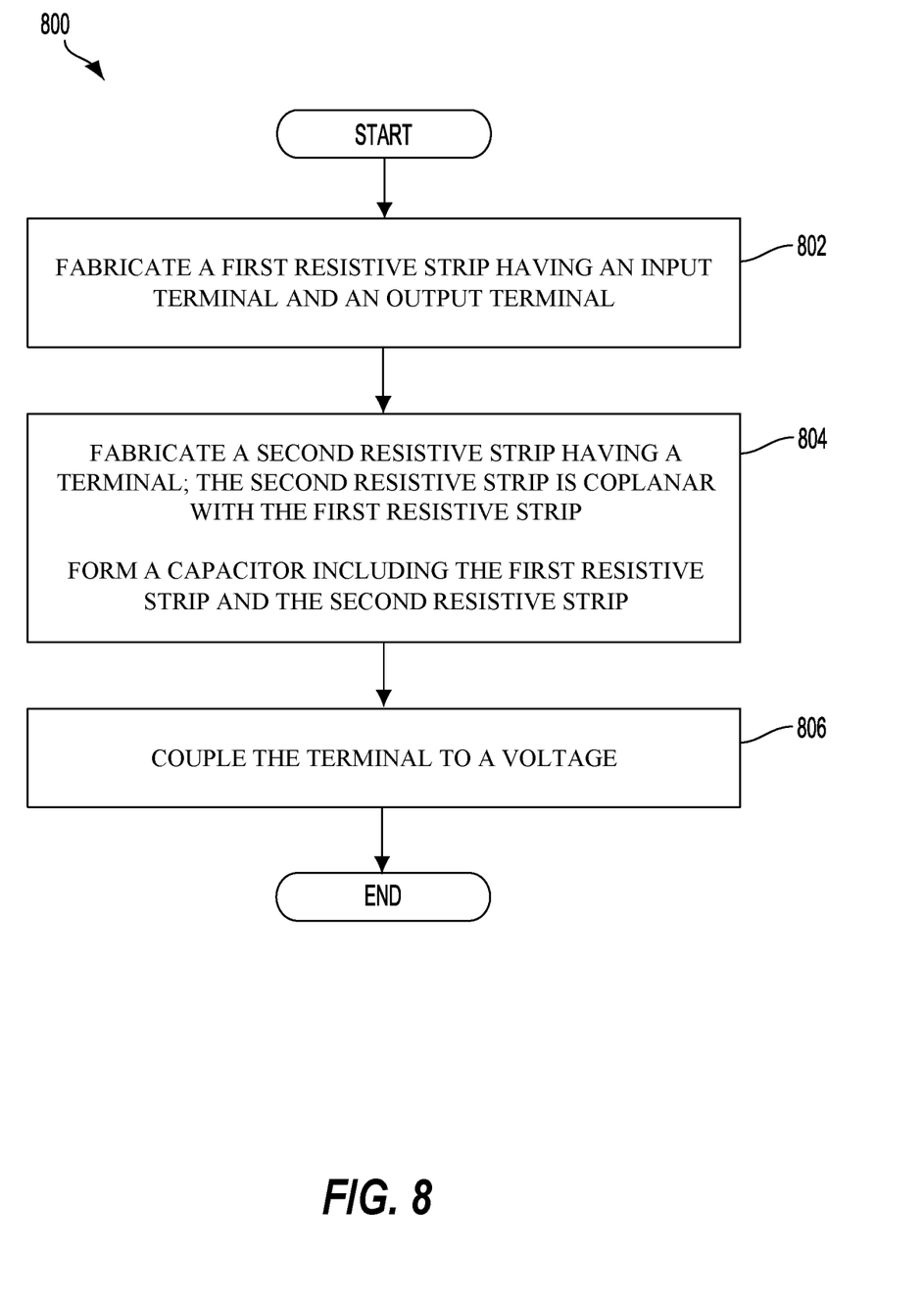
FIG. 8 illustrates a method of fabricating a delay cell, according to aspects of the present disclosure.

FIG. 8 illustrates a method 800 of fabricating a delay cell, according to aspects of the present disclosure. The method 800 begins at block 802, where a first resistive strip is fabricated having an input terminal and an output terminal. For example, as shown in FIG. 3, the first resistive strip 310 includes an input terminal Vi and an output terminal Vo.

At block 804, a second resistive strip is fabricated having a terminal. The second resistive strip is coplanar with the first resistive strip. A capacitor may be formed including the first resistive strip and the second resistive strip. For example, as shown in FIG. 3, the second resistive strip 320 may include a terminal 322 coplanar with the first resistive strip 310. A gap between the first resistive strip 310 and the second resistive strip 320 defines the capacitance.

At block 806, the terminal is coupled to a voltage. For example, as shown in FIG. 3, the second resistive strip 320 includes a terminal 322 coupled to a voltage (e.g., ground).

According to additional aspects of the present disclosure, the first resistive strip and the second resistive strip may be fabricated in a serpentine, spiral, octagonal, and/or circular shape.

According to an aspect of the present disclosure, a delay cell is described. In one configuration, the delay cell includes first resistive means. For example, the first resistive means may be the first resistive strips (e.g., 310, 410, 510, 610, and 710) as shown in FIGS. 3, 4, 5, 6, and 7. In one configuration, the delay cell includes second resistive means. For example, the second resistive means may be the second resistive strips (e.g., 320, 420, 520, 620, and 720) as shown in FIGS. 3, 4, 5, 6, and 7. In another aspect, the aforementioned means may be any module or any apparatus or material configured to perform the functions recited by the aforementioned means.

Figure 9:
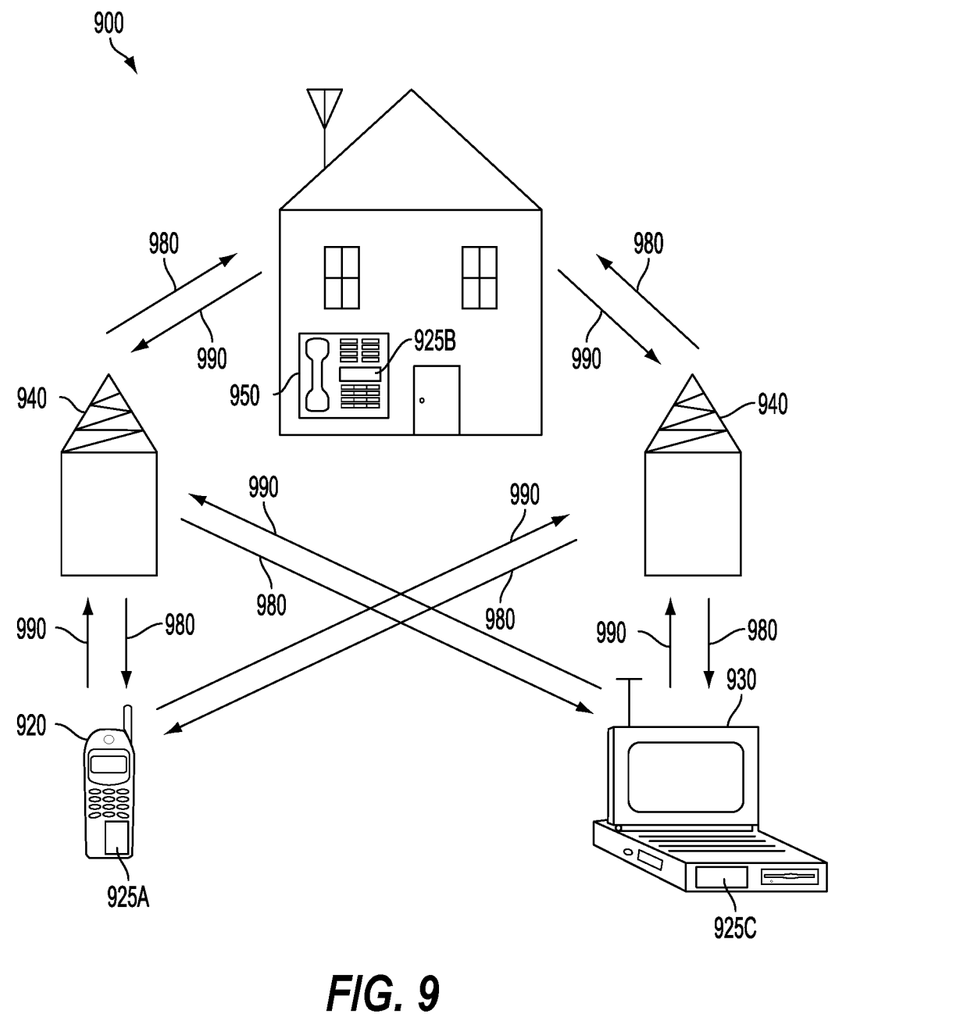
FIG. 9 is a block diagram showing an exemplary wireless communications system in which an aspect of the present disclosure may be advantageously employed.

FIG. 9 is a block diagram showing an exemplary wireless communications system 900 in which an aspect of the present disclosure may be advantageously employed. For purposes of illustration, FIG. 9 shows three remote units 920, 930, and 950 and two base stations 940. It will be recognized that wireless communications systems may have many more remote units and base stations. Remote units 920, 930, and 950 include IC devices 925A, 925B, and 925C that include the disclosed delay cell. It will be recognized that other devices may also include the disclosed delay cell, such as the base stations, switching devices, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communications systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 9 illustrates remote units according to the aspects of the present disclosure, the present disclosure is not limited to these exemplary illustrated units. Aspects of the present disclosure may be suitably employed in many devices, which include the disclosed delay cell.

Figure 10:
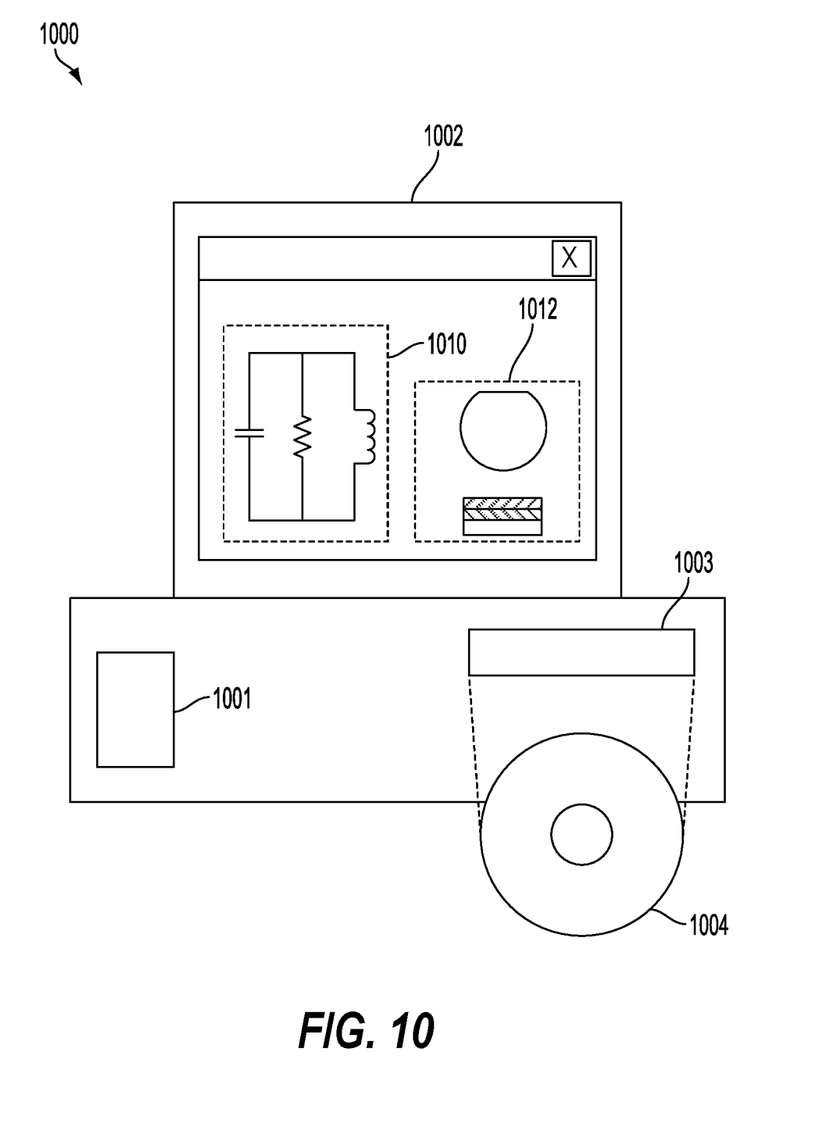
FIG. 10 is a block diagram illustrating a design workstation used for circuit, layout, and logic design of delay cells according to one configuration.

FIG. 10 is a block diagram illustrating a design workstation used for circuit, layout, and logic design of an IC structure, such as the delay cell disclosed above. A design workstation 1000 includes a hard disk 1001 containing operating system software, support files, and design software such as Cadence or OrCAD. The design workstation 1000 also includes a display 1002 to facilitate design of a circuit 1010 or an IC device 1012 including the disclosed delay cell. A storage medium 1004 is provided for tangibly storing the design of the circuit 1010 or the IC device 1012. The design of the circuit 1010 or the IC device 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the IC device 1012 including the disclosed delay cell by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on non-transitory computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein but is to be accorded the widest scope consistent with the principles and novel features disclosed herein.

What is claimed is:

1. An integrated circuit (IC) device, comprising:
    a first resistive strip formed in a metal layer having an input terminal and an output terminal, wherein the first resistive strip forms a resistor of a RC (resistor-capacitor) cell;
    a second resistive strip formed in the metal layer having a terminal coupled to a voltage, the second resistive strip being coplanar with the first resistive strip; and
    a capacitor of the RC cell formed by the first resistive strip, the second resistive strip, and a material between the first and second resistive strips.

2. The IC device of claim 1, wherein the first resistive strip and the second resistive strip comprise polysilicon.

3. The IC device of claim 1, wherein the second resistive strip includes portions substantially parallel to the first resistive strip.

4. The IC device of claim 1, wherein the first resistive strip is interdigitated with the second resistive strip.

5. The IC device of claim 1, wherein the RC cell is configured to be part of a delay cell or a filter.

6. The IC device of claim 1, wherein the first resistive strip and the second resistive strip are serpentine, spiral, octagonal, and/or circular in shape.

7. The IC device of claim 1, wherein the first resistive strip comprises a first resistive material and the second resistive strip comprises a second resistive material that is different from the first resistive material.

8. The IC device of claim 1, wherein a width of the first resistive strip is substantially equal to a gap between the first resistive strip and the second resistive strip.

9. The IC device of claim 8, wherein the width of the first resistive strip is correlated to the gap between the first resistive strip and the second resistive strip such that a product of the width and the gap is process-invariant.

10. The IC device of claim 1, integrated into a mobile phone, a set top box, a music player, a video player, an entertainment unit, a navigation device, a computer, a hand-held personal communications systems (PCS) unit, a portable data unit, and/or a fixed location data unit.

11. A method of fabricating an integrated circuit (IC) device comprising:
    fabricating a first resistive strip in a metal layer having an input terminal and an output terminal, wherein the first resistive strip forms a resistor of a RC (resistor-capacitor) cell;
    fabricating a second resistive strip coplanar with the first resistive strip in the metal layer, the second resistive strip having a terminal, and the first resistive strip, the second resistive strip, and a material between the first and second resistive strips forming a capacitor of the RC cell: and
    coupling the terminal to a voltage.

12. The method of claim 11, wherein the second resistive strip is fabricated with portions substantially parallel to the first resistive strip.

13. The method of claim 11, wherein the first resistive strip is interdigitated with the second resistive strip.

14. The method of claim 11, wherein the first resistive strip and the second resistive strip are fabricated in a serpentine, spiral, octagonal, and/or circular shape.

15. The method of claim 11, wherein the first resistive strip is fabricated with a width substantially equal to a gap between the first resistive strip and the second resistive strip.

16. The method of claim 11, wherein the IC device is integrated into a mobile phone, a set top box, a music player, a video player, an entertainment unit, a navigation device, a computer, a hand-held personal communications systems (PCS) unit, a portable data unit, and/or a fixed location data unit.

17. An integrated circuit (IC) device comprising:
    a first resistive means coupled to an input terminal and an output terminal wherein the first resistive strip forms a resistor of a RC (resistor-capacitor) cell;
    a second resistive means coupled to a voltage, the second resistive means being coplanar with the first resistive means; and
    a capacitor of the RC cell formed by the first resistive means, the second resistive means, and a material between the first and second resistive means.

18. The IC device of claim 17, wherein the RC cell is configured to be part of a delay cell or a filter.

19. The IC device of claim 17, wherein a width of the first resistive means is correlated to a gap between the first resistive means and the second resistive means such that a product of the width and the gap is process-invariant.

20. The IC device of claim 17, integrated into a mobile phone, a set top box, a music player, a video player, an entertainment unit, a navigation device, a computer, a hand-held personal communications systems (PCS) unit, a portable data unit, and/or a fixed location data unit.

* * * * *